United States Patent
Wang et al.

(10) Patent No.: US 11,556,423 B2
(45) Date of Patent: *Jan. 17, 2023

(54) USING ERASURE CODING IN A SINGLE REGION TO REDUCE THE LIKELIHOOD OF LOSING OBJECTS MAINTAINED IN CLOUD OBJECT STORAGE

(71) Applicant: VMware, Inc., Palo Alto, CA (US)

(72) Inventors: Wenguang Wang, Santa Clara, CA (US); Vamsi Gunturu, Cupertino, CA (US); Junlong Gao, Santa Clara, CA (US)

(73) Assignee: VMware, Inc., Palo Alto, CA (US)

( * ) Notice: Subject to any disclaimer, the term of this patent is extended or adjusted under 35 U.S.C. 154(b) by 104 days.

This patent is subject to a terminal disclaimer.

(21) Appl. No.: 16/882,246

(22) Filed: May 22, 2020

(65) Prior Publication Data

US 2021/0365318 A1   Nov. 25, 2021

(51) Int. Cl.

| G06F 11/10 | (2006.01) |
|---|---|
| G06F 11/00 | (2006.01) |
| H03M 13/15 | (2006.01) |
| H03M 13/00 | (2006.01) |
| G06F 12/02 | (2006.01) |
| H04L 67/1097 | (2022.01) |
| G06F 16/18 | (2019.01) |

(52) U.S. Cl.
CPC ...... *G06F 11/1088* (2013.01); *G06F 12/0253* (2013.01); *G06F 16/1805* (2019.01); *H03M 13/154* (2013.01); *H04L 67/1097* (2013.01); *G06F 2212/1044* (2013.01)

(58) Field of Classification Search
CPC ............ G06F 11/1088; G06F 16/1805; G06F 12/0253; G06F 2212/1044; H03M 13/154; H04L 67/1097
See application file for complete search history.

(56) References Cited

U.S. PATENT DOCUMENTS

| 7,386,758 B2 * | 6/2008 | Kitamura ............ G06F 11/1092 714/6.21 |
|---|---|---|
| 7,457,835 B2 | 11/2008 | Toebes et al. |
| 7,734,643 B1 * | 6/2010 | Waterhouse ............ G06F 16/10 707/770 |
| 9,740,560 B2 * | 8/2017 | Molaro ............... H03M 13/373 |
| 9,934,242 B2 | 4/2018 | Hunt et al. |

(Continued)

OTHER PUBLICATIONS

"Non-Final Office Actions issued in Related U.S. Appl. No. 16/882,327", dated Dec. 20, 2021, 7 pages.

(Continued)

*Primary Examiner* — Justin R Knapp (57) ABSTRACT

Techniques for using erasure coding in a single region to reduce the likelihood of losing objects in a cloud object storage platform are provided. In one set of embodiments, a computer system can upload a plurality of data objects to a region of a cloud object storage platform, where the plurality of data objects including modifications to a data set. The computer system can further compute a parity object based on the plurality of data objects, where the parity object encodes parity information for the plurality of data objects. The computer system can then upload the parity object to the same region where the plurality of data objects was uploaded.

21 Claims, 5 Drawing Sheets

(56) References Cited

U.S. PATENT DOCUMENTS

| | | | |
|---|---|---|---|
| 10,310,943 B2 * | 6/2019 | Huang | G06F 3/067 |
| 10,592,335 B2 | 3/2020 | Hegde et al. | |
| 10,650,035 B2 | 5/2020 | Maybee et al. | |
| 10,747,465 B2 | 8/2020 | Shang et al. | |
| 10,768,850 B2 | 9/2020 | Muniswamy-Reddy et al. | |
| 10,809,923 B2 * | 10/2020 | Frank | G06F 3/065 |
| 11,003,532 B2 * | 5/2021 | Huang | G06F 11/1076 |
| 11,036,420 B2 | 6/2021 | Thoppil et al. | |
| 11,074,129 B2 * | 7/2021 | Horn | H03M 13/154 |
| 11,093,139 B1 * | 8/2021 | Karr | G06F 3/0689 |
| 11,150,986 B2 * | 10/2021 | Li | H03M 13/373 |
| 2012/0173531 A1 | 7/2012 | Prahlad et al. | |
| 2012/0233463 A1 | 9/2012 | Holt et al. | |
| 2012/0233668 A1 | 9/2012 | Leafe et al. | |
| 2012/0303581 A1 | 11/2012 | Calder et al. | |
| 2014/0149351 A1 | 5/2014 | Bernbo et al. | |
| 2018/0341551 A1 | 11/2018 | Regni et al. | |
| 2019/0370170 A1 | 12/2019 | Oltean et al. | |
| 2020/0326858 A1 | 10/2020 | Thoppil et al. | |
| 2020/0348865 A1 | 11/2020 | Danilov et al. | |
| 2021/0034380 A1 | 2/2021 | Chrisman | |
| 2021/0049076 A1 | 2/2021 | Danilov et al. | |
| 2021/0263795 A1 * | 8/2021 | Li | G06F 11/1068 |
| 2021/0349793 A1 * | 11/2021 | Wang | G06F 11/1076 |
| 2021/0365319 A1 * | 11/2021 | Wang | G06F 11/1088 |

OTHER PUBLICATIONS

Non-Final Office Action issued in Related U.S. Appl. No. 16/882,338, dated May 2, 2022, 18 pages.
Final Office Action issued in Related U.S. Appl. No. 16/882,327, dated Mar. 31, 2022, 14 pages.

* cited by examiner

USING ERASURE CODING IN A SINGLE REGION TO REDUCE THE LIKELIHOOD OF LOSING OBJECTS MAINTAINED IN CLOUD OBJECT STORAGE

CROSS-REFERENCES TO RELATED APPLICATIONS

The present application is related to the following commonly-owned U.S. Patent Applications, filed concurrently herewith:

1. U.S. patent application Ser. No. 16/882,327 entitled "Using Data Mirroring Across Multiple Regions to Reduce the Likelihood of Losing Objects Maintained in Cloud Object Storage"; and
2. U.S. patent application Ser. No. 16/882,338 entitled "Using Erasure Coding Across Multiple Regions to Reduce the Likelihood of Losing Objects Maintained in Cloud Object Storage."

The entire contents of these applications are incorporated herein by reference for all purposes.

BACKGROUND

Object storage is a data storage model that manages data in the form of logical containers known as objects, rather than in the form of files (as in file storage) or blocks (as in block storage). Cloud object storage is an implementation of object storage that maintains these objects on a cloud infrastructure, which is a server infrastructure that is accessible via the Internet. Examples of existing cloud object storage platforms include Amazon Simple Storage Service (S3), Microsoft Azure Storage, and Google Cloud Storage.

Cloud object storage generally offers higher durability and lower cost than other types of storage solutions, and thus is often used by enterprise customers to backup large volumes of data for disaster recovery and long-term retention/archival. For instance, Amazon guarantees an annual object durability of 99.999999999% for S3, which means there is a 0.000000001% chance that a customer will lose a given object stored in S3 in a given year. However, because this durability guarantee applies to each individual object, as the number of objects maintained in S3 increases, the likelihood that at least one of the objects will be lost also increases. This risk of object loss can grow to a significant level for customers that backup very large numbers of objects.

For example, consider a customer A that has 10 petabytes (PB) of data stored in S3, divided into objects which are each 4 megabytes (MB) in size (resulting in 2,684,354,560 total objects). In this case, the annual durability of customer A's objects will be $0.99999999999^{2684354560} = \sim 0.97$ (or 97%), which means there is a 3% chance that customer A will lose at least one of its objects per year. As a further example, consider a customer B that has 100PB of data stored in S3, divided into the same 4 MB-sized objects (resulting in 26,843,545,600 total objects). In this case, the annual durability of customer B's objects will be $0.99999999999^{26843545600} = \sim 0.76$ (or 76%), which means there is a 24% chance that customer B will lose at least one of its objects per year.

DETAILED DESCRIPTION

In the following description, for purposes of explanation, numerous examples and details are set forth in order to provide an understanding of various embodiments. It will be evident, however, to one skilled in the art that certain embodiments can be practiced without some of these details, or can be practiced with modifications or equivalents thereof

1. Overview

Embodiments of the present disclosure are directed to techniques for using erasure coding in the context of a single region of a cloud object storage platform to reduce the likelihood of losing objects maintained in that region of the platform. As used herein, a "region" is a set of cloud infrastructure servers located within a defined geographic area (e.g., Eastern U.S., Western U.S., etc.) and a "region of a cloud object storage platform" is a region that hosts a portion of such a platform. "Erasure coding" is a data protection scheme that involves computing and storing parity information for groups of data fragments. Well-known erasure coding implementations in the field of distributed/multi-disk storage include Redundant Array of Independent Disks (RAID) level 5 (RAID-5) and RAID level 6 (RAID-6).

At a high level, the techniques of the present disclosure comprise grouping data objects that are uploaded to a given region R of a cloud object storage platform into "virtual segments" and computing at least one parity object for each virtual segment that encodes parity information for the virtual segment's member data objects. This parity information can be understood as redundancy information that is dependent upon the data content of those member data objects (e.g., an XOR sum). Once computed, the parity objects are uploaded to the same region R as their corresponding data objects.

At a later time, if an attempt to read a given data object O from region R fails because O has become lost (i.e., corrupted or otherwise inaccessible), the other data and parity objects in data object O's virtual segment can be retrieved from region R. Data object O can then be reconstructed using the retrieved data and parity objects, thereby allowing data object O to be successfully read (and thus effectively increasing the durability of data object O beyond the durability level guaranteed by the cloud object storage provider).

In addition to the foregoing, the techniques of the present disclosure include modified workflows for garbage collecting the data objects that have been uploaded to region R. With these modified workflows, the data objects can be garbage collected in a manner that ensures the data protection provided by the erasure coding mechanism noted above is kept intact. These and other aspects are described in further detail in the sections that follow.

2. Example System Environment and Solution Architecture

Figure 1:
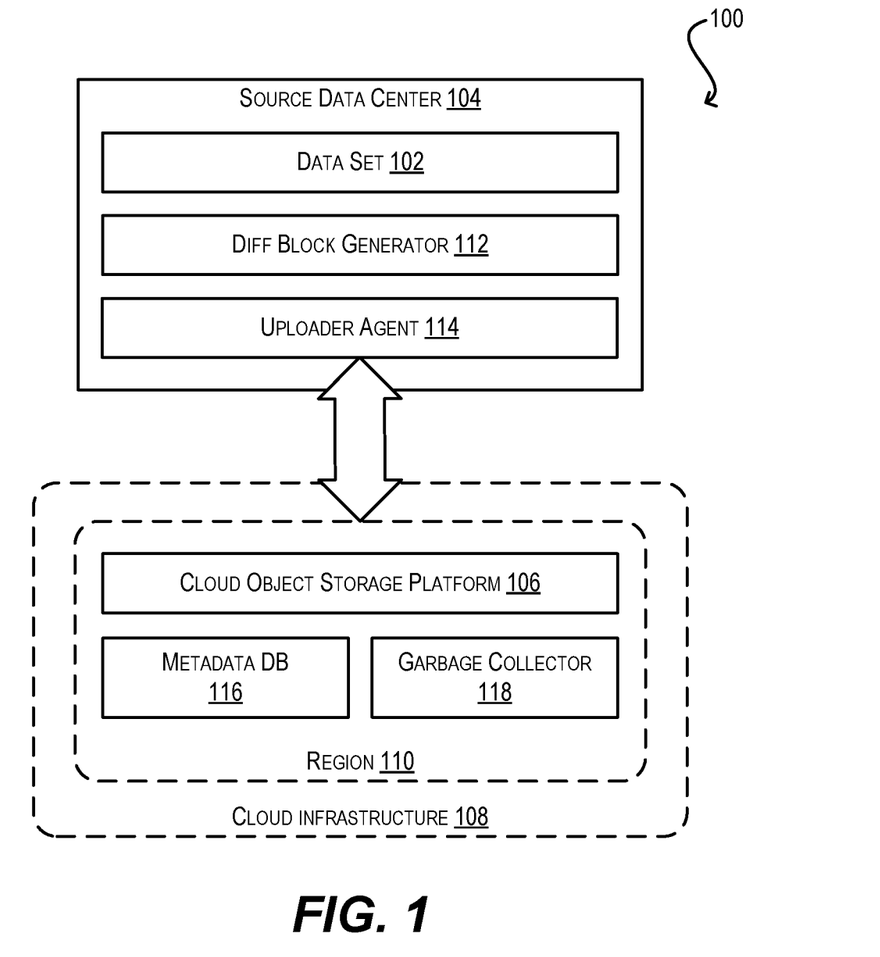
FIG. 1 depicts an example system environment.

To provide context for the embodiments presented herein, FIG. 1 depicts an example system environment 100 in which a data set 102 is periodically backed up from a source data center 104 to a cloud object storage platform 106 that is part of a cloud infrastructure 108. Data set 102 may be, e.g., a virtual disk file (VMDK), a hyper-converged infrastructure (HCI) storage object, or any other collection of data that consists of a base version and multiple delta versions comprising updates/modifications made to data set 102 over time. Source data center 104 may be operated by a customer of cloud object storage platform 106/cloud infrastructure 108, such as an enterprise. Cloud object storage platform 106/cloud infrastructure 108 may be operated by a third-party cloud service provider, such as Amazon, Microsoft, Google, or the like.

As shown, cloud object storage platform 106 is deployed in a region 110, which is a set of servers (or data centers) of cloud infrastructure 108 that are clustered in a particular geographic area. Examples of such geographic areas include the Eastern U.S., the Western U.S., South America, and so on. Although only a single region is depicted in FIG. 1 for simplicity of illustration, cloud infrastructure 108 will typically include a plurality of geographically dispersed regions (to ensure that global customers of cloud infrastructure 108 are relatively close to at least one region) and cloud object storage platform 106 will typically be deployed across several, if not all, of those regions. In the example of FIG. 1, region 110 is assumed to be the region that is geographically closest to source data center 104, and thus source data center 104 is configured to backup data set 102 to the portion of cloud object storage platform 106 deployed in region 110.

To carry out this backup process, source data center 104 includes a diff block generator 112 and an uploader agent 114. In operation, diff block generator 112 identifies logical data blocks in data set 102 that have been modified and provides those logical data blocks to uploader agent 114. In response, uploader agent 114 packages the logical data blocks into objects (referred to herein as "data objects") which conform to the object format of cloud object storage platform 106 and uploads the data objects to region 110 of platform 106. Uploader agent 114 also determines file system metadata changes arising out of the data block modifications, packages the metadata changes into "metadata objects," and uploads the metadata objects to a separate metadata database 116 deployed in region 110.

For purposes of the present disclosure, it is assumed that each data object uploaded to cloud object storage platform 106 has a moderately large (but not too large) fixed size, such as 4 MB (subject to a certain degree of variation due to compression and other factors). This helps reduce the API (application programming interface) costs of uploading data to platform 106 because (1) many cloud object storage platforms charge a fee for each service API invoked against the platform, and (2) uploading data in the form of larger, rather than smaller, objects decreases the number of upload (i.e., PUT) APIs that need to be invoked, which in turn keeps API costs low. At the same time, avoiding a very large object size reduces the overhead of performing object garbage collection (explained below).

In addition, for various reasons, it is assumed that the uploaded data objects are maintained in cloud object storage platform 106 using a log-structured file system (LFS) disk layout. As known in the art, an LFS is a file system in which data is not overwritten in place on disk; instead, each time an update is made to a piece of data, the latest version of that data is written to a new physical disk location in a sequential log format (and thus any older versions of that data remain, at least temporarily, on disk). In the context of FIG. 1, this means that as modifications are made to the logical data blocks of data set 102, uploader agent 114 packages the modified data blocks into new data objects (having, e.g., monotonically increasing log sequence numbers) and uploads those new data objects to cloud object storage platform 106. without overwriting previously uploaded data objects.

Figure 2:
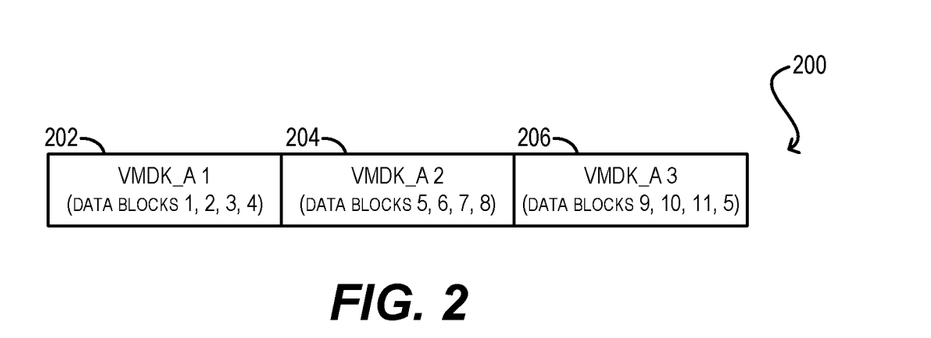
FIG. 2 depicts a log of data objects.

By way of example, FIG. 2 depicts a log of data objects 200 that may be created, via uploader agent 114, in region 110 of cloud object storage platform 106 for a data set named "VMDK_A." As shown in FIG. 2, log 200 includes a first data object "VMDK_A 1" (reference numeral 202) that comprises the data content of logical data blocks 1, 2, 3, and 4 of VMDK_A, a second data object "VMDK_A 2" (reference numeral 204) that comprises the data content of logical data blocks 5, 6, 7, and 8 of VMDK_A, and a third data object "VMDK_A 3" (reference numeral 206) that comprises the data content of logical data blocks 9, 10, 11, and 5 of VMDK_A. The number specified in the name of each data object indicates the sequence of that object within log 200. Because logical data block 5 appears twice within log 200 (once in VMDK_A 2 and again in VMDK_A 3), the version of data block 5 in the latest/highest-numbered data object VMDK_A 3 is considered the "live," or most current, version of this data block. In contrast, the version of data block 5 in older data object VMDK_A 2 is considered a "dead" version because it has been superseded by the version in newer data object VMDK_A 3.

One consequence of employing an LFS as described above is that, over time, some data objects in cloud object storage platform 106 will accumulate a high percentage of dead data blocks and therefore consume an unnecessary amount of storage space in the platform. To mitigate this, a garbage collector component 118 is implemented in region 110 for garbage collecting (or in other words, "segment cleaning") these data objects. In various embodiments, garbage collector 118 identifies, via metadata database 116, data objects in region 110 of cloud object storage platform 106 that are candidates for cleaning (e.g., data objects that have a relatively large number of dead data blocks and/or exceed a threshold age). Then, for each of the candidate data objects, garbage collector 118 determines the live data blocks remaining in the data object, reads the live data blocks, and writes out the live data blocks to a brand new data object in region 110. Upon completing this process, garbage collector 118 marks the candidate data objects for deletion, thereby reclaiming the storage space consumed by those objects.

As discussed in the Background section, the providers of cloud object storage platforms such as platform 106 of FIG. 1 often guarantee a certain level of durability for the objects maintained on their platforms. For example, with respect to Amazon S3, Amazon guarantees "11 nines" of object durability (or 99.999999999%), which means there is only a 0.000000001% chance that each object stored in S3 will fail in a given year. While this level of durability appears impressive, because it applies to each individual object (rather than collectively to all objects), as the number of objects uploaded to S3 increases, the likelihood of losing at least one of those objects will also increase. As a result, customers that upload extremely large numbers of objects face a significant risk of object loss (e.g., an annual 24% chance of loss for a customer that uploads 100PB of data in the form of 4 MB objects).

Figure 3:
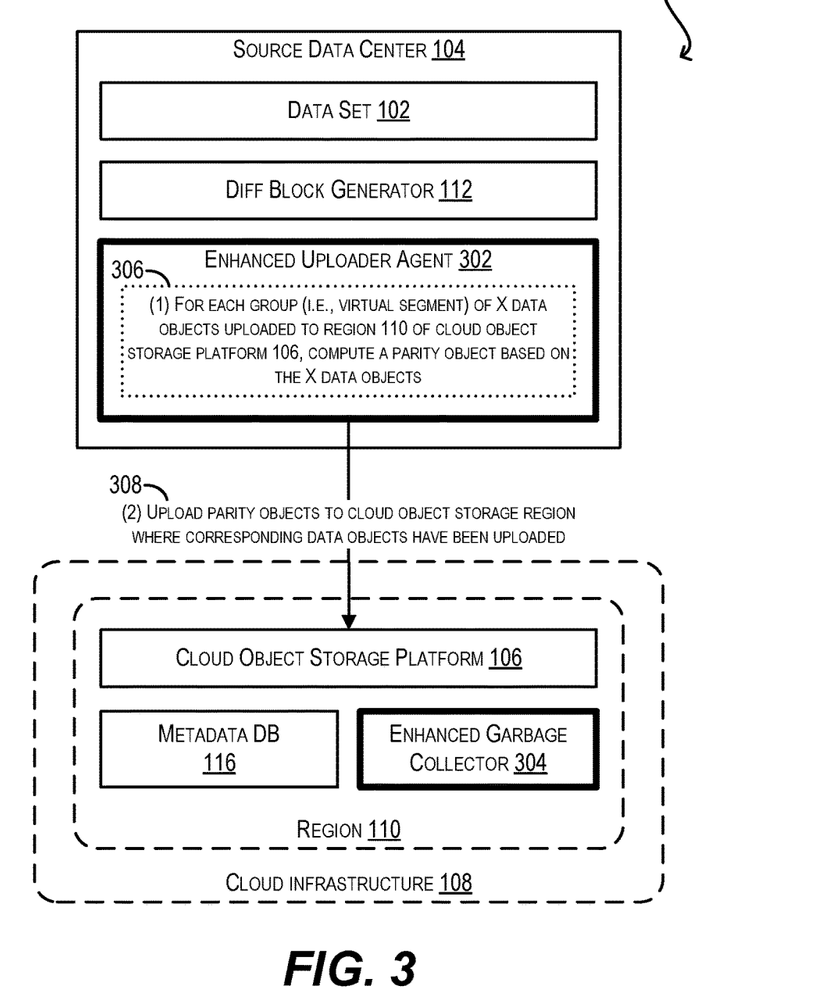
FIG. 3 depicts a modified version of the system environment of FIG. 1 according to certain embodiments.
Figure 4:
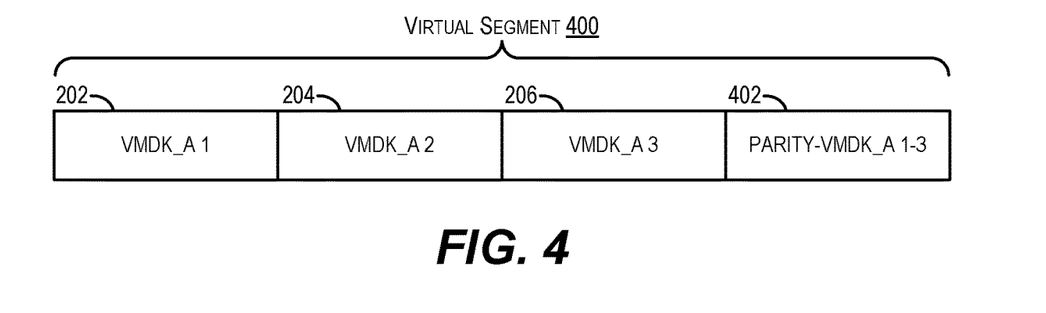
FIG. 4 depicts a virtual segment according to certain embodiments.

To address this and other similar problems, FIG. 3 depicts a modified version of system environment 100 of FIG. 1 (i.e., system environment 300) that includes, inter alia, an enhanced uploader agent 302 within source data center 104. As shown in FIG. 3, at the time of uploading data objects to region 110 of cloud object storage platform 106, enhanced uploader agent 302 can compute a parity object for each group of X sequential data objects (referred to as a "virtual segment") that encodes parity information regarding the data content of these objects (step (1); reference numeral 306). For example, in one set of embodiments, enhanced uploader agent 302 may compute one parity object for every three data objects in a manner similar to 3+1 RAID-5. This option is illustrated in FIG. 4, which depicts a virtual segment 400 comprising the three data objects of FIG. 2 (i.e., VMDK_A 1, VMDK_A 2, and VMDK_A 3) and a parity object "PARITY-VMDK_A 1-3" (reference numeral 402) computed from those three data objects. In alternative embodiments, enhanced uploader agent 302 may use any other reasonable erasure coding schema, such as two parity objects for every four data objects (similar to 4+2 RAID-6), one parity object for every 5 data objects (similar to 5+1 RAID-5), etc. Upon computing the parity objects, enhanced uploader agent 302 can upload the parity objects to the same region as their corresponding data objects (i.e., region 110) (step (2) of FIG. 3; reference numeral 308).

With these parity objects in place, if source data center 104 (or some other storage client, such as a secondary/backup data center) subsequently attempts to read a given data object O from region 110 but fails to do so because O has become lost, the other data and parity objects in data object O's virtual segment can be retrieved from region 110. Data object O can then be reconstructed using the retrieved data and parity objects (in accordance with conventional erasure coding reconstruction algorithms), thereby allowing data object O to be successfully read. Accordingly, this solution approach and architecture advantageously increases the overall object durability of cloud object storage platform 106, beyond any durability guarantees that may be provided at the platform level by the cloud object storage provider (subject to the caveat that object failures within a given region are assumed to be uncorrelated). For example, with respect to the scenario mentioned earlier in which a customer uploads 100PB of data to Amazon S3 in the form of 4 MB objects, if an erasure coding schema similar to 5+1 RAID-5 is employed (i.e., one parity object for every 5 data objects), the solution approach/architecture shown in FIG. 3 reduces the likelihood that the customer will lose at least one object within a given year from 24% to effectively 0%.

In addition to enhanced uploader agent 302, in certain embodiments system environment 300 further includes an enhanced garbage collector 304 in region 110. As detailed in section (4) below, enhanced garbage collector 304 can implement modified workflows for garbage collecting the data objects uploaded by enhanced uploader agent 302 to region 110. This is desirable because if conventional LFS garbage collection techniques are employed, the parity objects for the virtual segments in platform 106 may be rendered corrupt/invalid. Thus, enhanced garbage collector 304 avoids this issue by performing garbage collection in a manner that is "virtual segment-aware" (i.e., takes into account the existence of the virtual segments).

It should be appreciated that system environment 300 of FIG. 3 is illustrative and not intended to limit embodiments of the present disclosure. For instance, in some embodiments, a portion (or all) of the functionality attributed to enhanced components 302 and 304 may be implemented at different locations in system environment 300. By way of example, a portion of the functionality attributed to enhanced uploader agent 302 may be implemented via an "uploader server" that is run in cloud infrastructure 108. Further, the various components shown in system environment 300 may include sub-components and/or functions that are not specifically described. One of ordinary skill in the art will recognize other variations, modifications, and alternatives.

3. Enhanced Uploader Agent Workflow

Figure 5:
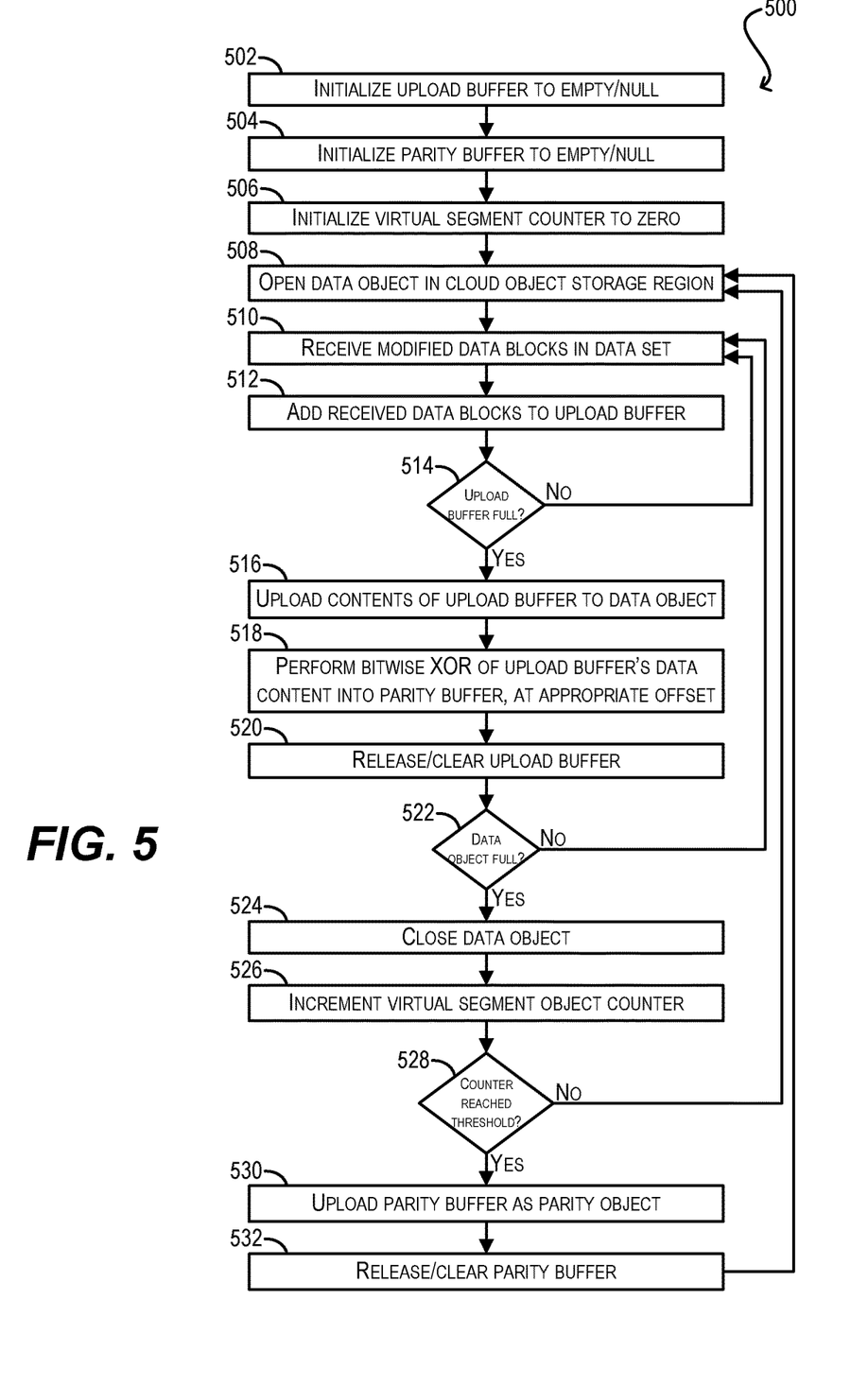
FIG. 5 depicts an upload workflow according to certain embodiments.

FIG. 5 depicts a workflow 500 that provides additional details regarding the processing that may be performed by enhanced uploader agent 302 of FIG. 3 for uploading data set 102 from source data center 104 to region 110 of cloud object storage platform 106 using erasure coding according to certain embodiments. For efficiency reasons, workflow 500 assumes that enhanced uploader agent 302 uploads data in a streaming fashion using "chunks" that are smaller in size than a data object (e.g., 64 KB chunks). However, in alternative embodiments this chunk-based streaming can be omitted.

Starting with steps 502 and 504, enhanced uploader agent 302 can initialize an upload buffer and a parity buffer to empty/null, where the size of the upload buffer is equal to the size of a single chunk (e.g., 64 KB) and the size of the parity buffer is equal to the size of a single data object (e.g., 4 MB). In addition, at step 506, enhanced uploader agent 302 can initialize a virtual segment object counter to zero.

At step 508, enhanced uploader agent 302 can open (or in other words, initialize for writing) a new data object in region 110 of cloud object storage platform 106 with an appropriate object name. For example, in a particular embodiment, the object name can consist of the name of data set 102 and a number indicating the current LFS log sequence for the object with respect to the data set.

At step 510, enhanced uploader agent 302 can receive, from diff block generator 112, one or more logical data blocks that have been modified in data set 102. Enhanced uploader agent 302 can then add the data block(s) to the upload buffer (step 512) and check whether the upload buffer is now full (step 514).

If the answer at step 514 is no, enhanced uploader agent 302 can return to step 510 in order to receive additional modified data blocks from diff block generator 112. However, if the answer at step 514 is yes, enhanced uploader agent 302 can upload (i.e., write) the contents of the upload buffer to the opened data object in region 110 (step 516). In addition, enhanced uploader agent 302 can perform a bit-wise XOR of the upload buffer's data content into the parity buffer at an appropriate offset, thereby incorporating that data content into the parity object that will ultimately be uploaded for the virtual segment of the opened data object (step 518). For example, if the current chunk is the second chunk uploaded for the data object, the data content of the upload buffer can be XOR'ed into the parity buffer starting at an offset of 64 KB.

Upon completing the XOR operation, enhanced uploader agent 302 can release/clear the upload buffer (step 520) and check whether the opened data object is now full (e.g., has reached its predefined size of 4 MB) (step 522). If the answer is no, enhanced uploader agent 302 can return to step 510.

However, if the answer at step 522 is yes, enhanced uploader agent 302 can close the data object opened at step 508 (step 524), increment the virtual segment object counter by 1 (step 526), and check whether the virtual segment object counter has reached a threshold X, where X is the number of data objects to be included in each virtual segment (step 528). If not, enhanced uploader agent 302 can return to step 508 in order to open a new data object.

If the answer at block 528 is yes, enhanced uploader agent 302 can conclude than an entire virtual segment of data objects has been uploaded and thus can upload the content of the parity buffer as a new parity object for that virtual segment to region 110, with an appropriate object name (step 530). For example, as shown in FIG. 2, if the names of the data objects in the uploaded virtual segment are VMDK_A 1, VMDK_A 2, and VMDK_A 3, the name of the parity object for that virtual segment can be PARITY-VMDK_A 1-3.

Finally, at step 532, enhanced uploader agent 302 can release/clear the parity buffer and return to step 508 to open a new data object for the next virtual segment.

4. Enhanced Garbage Collector Workflows

Figure 6:
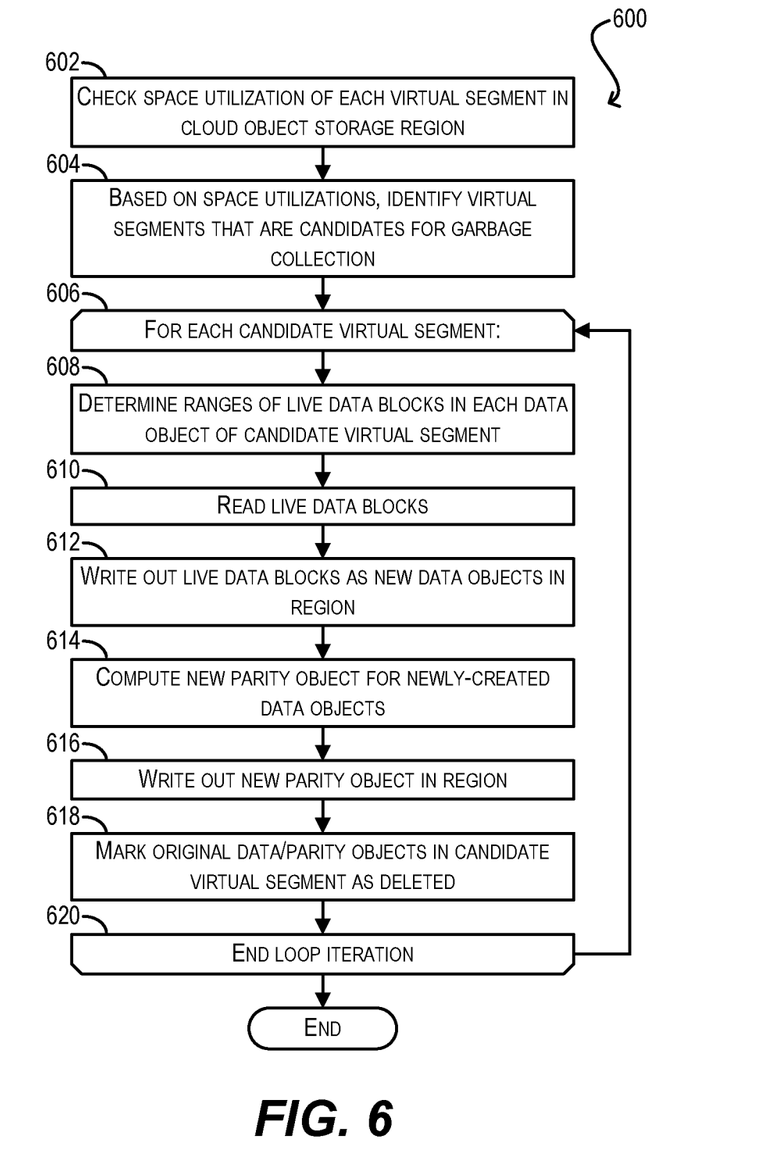
FIG. 6 depicts a first garbage collection workflow according to certain embodiments.
Figure 7:
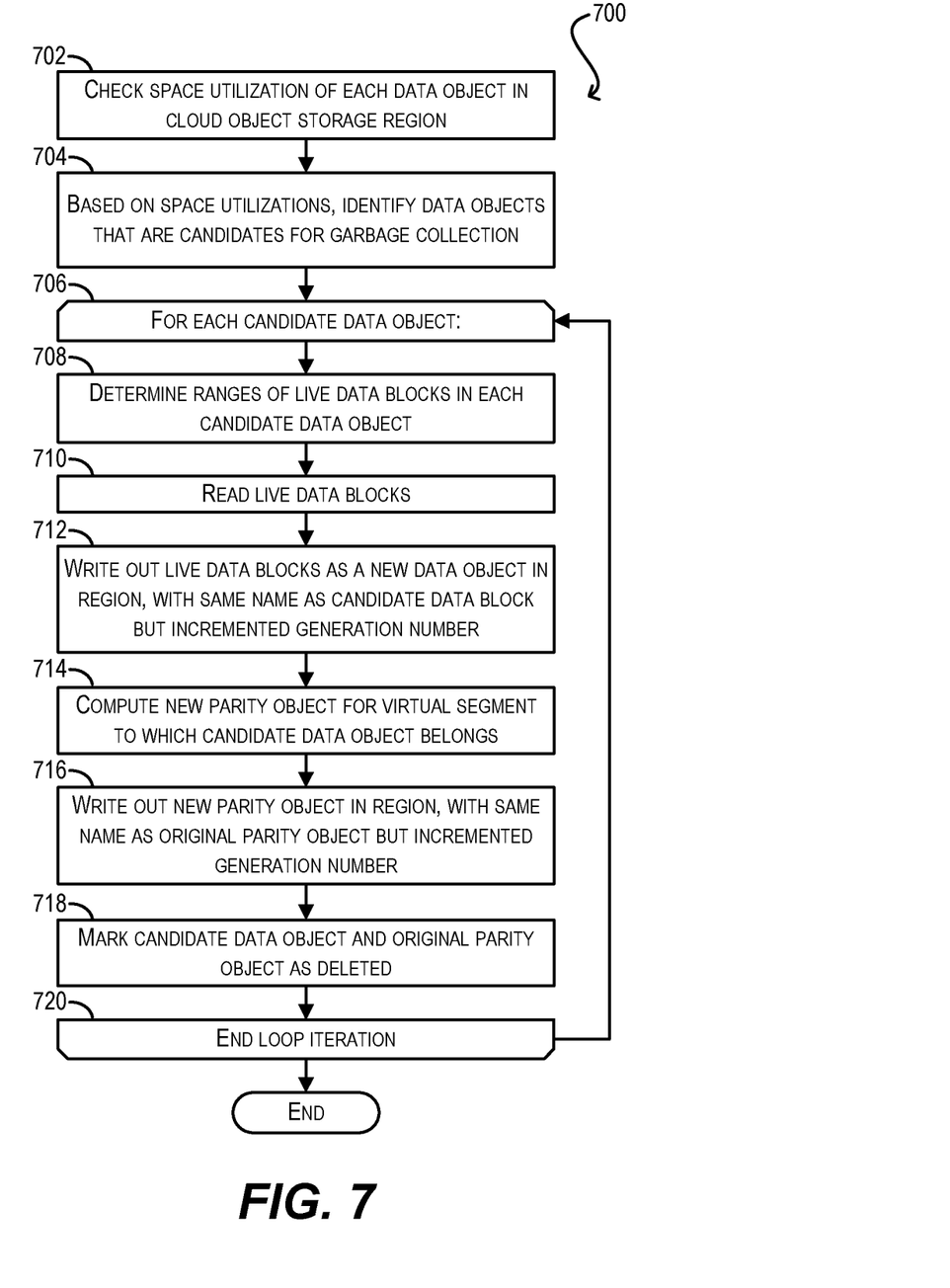
FIG. 7 depicts a second garbage collection workflow according to certain embodiments.

FIGS. 6 and 7 depict workflows 600 and 700 respectively that can be performed by enhanced garbage collector 304 of FIG. 3 for garbage collecting data objects uploaded by enhanced uploader agent 302 to region 110 (via, e.g., workflow 500) in a "virtual segment-aware" manner according to certain embodiments. In particular, workflow 600 illustrates an approach in which enhanced garbage collector 304 garbage collects entire virtual segments, rather than individual data objects, in region 110 as a unit. The avoids situations where garbage collecting a subset of data objects within a virtual segment causes the parity object in that virtual segment to become invalid.

In contrast, workflow 700 illustrates an approach in which enhanced garbage collector 304 garbage collects individual data objects as in conventional approaches, but also updates the parity objects of affected virtual segments so that those parity objects remain correct/valid. This advantageously allows for greater garbage collection granularity and efficiency than the approach of FIG. 6. Workflow 700 assumes that each data object and parity object in a virtual segment has a "generation number" appended to the end of the object's name (e.g., VMDK_A 1-g1). This generation number is incremented whenever a data object is garbage collected (and thus its live data blocks are written to a new, smaller data object with the same name) or a parity object is updated to account for garbage collected data object(s) within its virtual segment.

Starting with workflow 600, at steps 602 and 604, enhanced garbage collector 304 can check the space utilization of each virtual segment maintained in region 110 of cloud object storage platform 106 and, based on these space utilizations, identify virtual segments that are candidates for garbage collection. In one set of embodiments, the space utilization check at step 602 can comprise accessing a segment usage table (SUT) in metadata database 116 to determine the number of live data blocks in the data objects of each virtual segment and the candidate identification at step 604 can comprise identifying those virtual segments whose percentage of live data blocks is below a threshold (e.g., 30%).

At step 606, enhanced garbage collector 304 can enter a loop for each candidate virtual segment identified at step 604. Within this loop, enhanced garbage collector 304 can determine, via metadata database 116, the ranges of live data blocks in each data object of the candidate virtual segment (step 608), read those live data blocks (step 610), and write out the live data blocks as new data objects in region 110 (step 612). Enhanced garbage collector 304 can further compute a new parity object for the newly-created data objects (step 614) and write out the parity object in region 110 (step 616).

Finally, enhanced garbage collector 304 can mark all of the original data and parity objects in the candidate virtual segment as being deleted (step 618) and reach the end of the current loop iteration (step 620). The foregoing process can repeat until all candidate virtual segments have been processed.

Turning now to workflow 700, at steps 702 and 704, enhanced garbage collector 304 can check the space utilization of each data object maintained in region 110 of cloud object storage platform 106 and, based on these space utilizations, identify data objects that are candidates for garbage collection. Similar to steps 602 and 604 of workflow 600, the space utilization check at step 702 can comprise accessing the SUT in metadata database 116 to determine the number of live data blocks in each data object and the candidate identification at step 704 can comprise identifying those data objects whose percentage of live data blocks is below a threshold (e.g., 30%).

At step 706, enhanced garbage collector 304 can enter a loop for each candidate data object identified at step 704. Within this loop, enhanced garbage collector 304 can determine, via metadata database 116, the range(s) of live data blocks in the candidate data object (step 708), read those live data blocks (step 710), and write out the live data blocks to a new data object in region 110 that has the same name as the candidate data object, but with an incremented generation number (step 712). For example, if the name of the candidate data object is VMDK_A 1-g1, the name of the new data object would be VMDK_A 1-g2. In this new data object, it assumed that all of the block locations corresponding to dead data blocks in the candidate data object are padded with zero.

Upon writing out the new data object at step 712, enhanced garbage collector 304 can compute a new parity object for the virtual segment to which the candidate data object belongs, based on the content of the candidate data object and the content of the original parity object of the virtual segment (step 714). For instance, in a particular embodiment, step 714 can comprise looping through the dead data blocks in the candidate data object and, for each dead data block, calculating a new parity value based on the content of the dead data block in the candidate data object and the parity value for the dead data block in the original parity object. Enhanced garbage collector 304 can then write out the new parity object in region 110 with the same name as the original parity object, but with an incremented generation number (step 716).

Finally, enhanced garbage collector 304 can mark the candidate data object and the original parity object as being deleted (step 718) and reach the end of the current loop iteration (step 720). The foregoing process can repeat until all candidate data objects have been processed.

Certain embodiments described herein can employ various computer-implemented operations involving data stored in computer systems. For example, these operations can require physical manipulation of physical quantities—usually, though not necessarily, these quantities take the form of electrical or magnetic signals, where they (or representations of them) are capable of being stored, transferred, combined, compared, or otherwise manipulated. Such manipulations are often referred to in terms such as producing, identifying, determining, comparing, etc. Any operations described herein that form part of one or more embodiments can be useful machine operations.

Further, one or more embodiments can relate to a device or an apparatus for performing the foregoing operations. The apparatus can be specially constructed for specific required purposes, or it can be a general purpose computer system selectively activated or configured by program code stored in the computer system. In particular, various general purpose machines may be used with computer programs written in accordance with the teachings herein, or it may be more convenient to construct a more specialized apparatus to perform the required operations. The various embodiments described herein can be practiced with other computer system configurations including handheld devices, microprocessor systems, microprocessor-based or programmable consumer electronics, minicomputers, mainframe computers, and the like.

Yet further, one or more embodiments can be implemented as one or more computer programs or as one or more computer program modules embodied in one or more non-transitory computer readable storage media. The term non-transitory computer readable storage medium refers to any data storage device that can store data which can thereafter be input to a computer system. The non-transitory computer readable media may be based on any existing or subsequently developed technology for embodying computer programs in a manner that enables them to be read by a computer system. Examples of non-transitory computer readable media include a hard drive, network attached storage (NAS), read-only memory, random-access memory, flash-based nonvolatile memory (e.g., a flash memory card or a solid state disk), persistent memory, NVMe device, a CD (Compact Disc) (e.g., CD-ROM, CD-R, CD-RW, etc.), a DVD (Digital Versatile Disc), a magnetic tape, and other optical and non-optical data storage devices. The non-transitory computer readable media can also be distributed over a network coupled computer system so that the computer readable code is stored and executed in a distributed fashion.

Finally, boundaries between various components, operations, and data stores are somewhat arbitrary, and particular operations are illustrated in the context of specific illustrative configurations. Other allocations of functionality are envisioned and may fall within the scope of the invention(s). In general, structures and functionality presented as separate components in exemplary configurations can be implemented as a combined structure or component. Similarly, structures and functionality presented as a single component can be implemented as separate components.

As used in the description herein and throughout the claims that follow, "a," "an," and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of particular embodiments may be implemented. These examples and embodiments should not be deemed to be the only embodiments, and are presented to illustrate the flexibility and advantages of particular embodiments as defined by the following claims. Other arrangements, embodiments, implementations and equivalents can be employed without departing from the scope hereof as defined by the claims.

What is claimed is:

1. A method comprising:
   uploading, by a computer system, a plurality of data objects to a region of a cloud object storage platform, the region corresponding to a set of servers of the cloud object storage platform located in a defined geographic area, the plurality of data objects including modifications to a data set;
   computing, by the computer system, a parity object based on the plurality of data objects, the parity object encoding parity information for the plurality of data objects, the computing comprising, for each data object in the plurality of data objects:
      adding data blocks of said each data object to an upload buffer; and
      performing a bitwise XOR of data content of the upload buffer with data content of a parity buffer, wherein the data content of the upload buffer includes the added data blocks, and wherein the performing of the bitwise XOR incorporates the data content of the upload buffer into the data content of the parity buffer; and
   uploading, by the computer system, the data content of the parity buffer as the parity object to the region of the cloud object storage platform.

2. The method of claim 1 further comprising:
   attempting to read a data object in the plurality of data objects from the region of the cloud object storage platform; and
   upon failure of the read attempt:
      reading the parity object and other data objects in the plurality of data objects from the region; and
      reconstructing the data object based on the parity object and the other data objects.

3. The method of claim 1 wherein the plurality of data objects are maintained in the region of the cloud object storage platform using a log-structured file system (LFS) disk layout.

4. The method of claim 1 wherein each of the plurality of data objects is uploaded to the region in a streaming manner via chunks that are each smaller in size than a predefined size for said each data object.

5. The method of claim 1 wherein a garbage collector running in the region garbage collects the plurality of data objects in a manner that is aware of the parity object.

6. The method of claim 5 wherein the garbage collector garbage collects the plurality of data objects by:
   identifying the plurality of data objects as a single unit to be garbage collected;
   determining live data blocks in the plurality of data objects;
   reading the live data blocks;
   writing out the live data blocks to a plurality of new data objects in the region;
   computing a new parity object based on the plurality of new data objects;
   writing out the new parity object in the region; and
   marking the plurality of data objects and the parity object as being deleted.

7. The method of claim 5 wherein the garbage collector garbage collects the plurality of data objects by:
   identifying a subset of the plurality of data objects as being candidate data objects for garbage collection; and
   for each candidate data object:
      determining live data blocks in the candidate data object;
      reading the live data blocks;
      writing out the live data blocks to a new data object in the region;
      computing a new parity object for the plurality of data objects based on the candidate data object and the parity object;
      writing out the new parity object in the region; and
      marking the candidate data object and the parity object as being deleted.

8. A non-transitory computer readable storage medium having stored thereon program code executable by a computer system, the program code embodying a method comprising:

uploading a plurality of data objects to a region of a cloud object storage platform, the region corresponding to a set of servers of the cloud object storage platform located in a defined geographic area, the plurality of data objects including modifications to a data set;

computing a parity object based on the plurality of data objects, the parity object encoding parity information for the plurality of data objects, the computing comprising, for each data object in the plurality of data objects:

adding data blocks of said each data object to an upload buffer; and performing a bitwise XOR of data content of the upload buffer with data content of a parity buffer, wherein the data content of the upload buffer includes the added data blocks, and wherein the performing of the bitwise XOR incorporates the data content of the upload buffer into the data content of the parity buffer; and uploading the data content of the parity buffer as the parity object to the region of the cloud object storage platform.

9. The non-transitory computer readable storage medium of claim 8 wherein the method further comprises:

attempting to read a data object in the plurality of data objects from the region of the cloud object storage platform; and upon failure of the read attempt:

reading the parity object and other data objects in the plurality of data objects from the region; and reconstructing the data object based on the parity object and the other data objects.

10. The non-transitory computer readable storage medium of claim 8 wherein the plurality of data objects are maintained in the region of the cloud object storage platform using a log-structured file system (LFS) disk layout.

11. The non-transitory computer readable storage medium of claim 8 wherein each of the plurality of data objects is uploaded to the region in a streaming manner via chunks that are each smaller in size than a predefined size for said each data object.

12. The non-transitory computer readable storage medium of claim 8 wherein a garbage collector running in the region garbage collects the plurality of data objects in a manner that is aware of the parity object.

13. The non-transitory computer readable storage medium of claim 12 wherein the garbage collector garbage collects the plurality of data objects by:

identifying the plurality of data objects as a single unit to be garbage collected;

determining live data blocks in the plurality of data objects;

reading the live data blocks;

writing out the live data blocks to a plurality of new data objects in the region;

computing a new parity object based on the plurality of new data objects;

writing out the new parity object in the region; and marking the plurality of data objects and the parity object as being deleted.

14. The non-transitory computer readable storage medium of claim 12 wherein the garbage collector garbage collects the plurality of data objects by:

identifying a subset of the plurality of data objects as being candidate data objects for garbage collection; and for each candidate data object:

determining live data blocks in the candidate data object;

reading the live data blocks;

writing out the live data blocks to a new data object in the region;

computing a new parity object for the plurality of data objects based on the candidate data object and the parity object;

writing out the new parity object in the region; and marking the candidate data object and the parity object as being deleted.

15. A computer system comprising:

a processor; and a non-transitory computer readable medium having stored thereon program code that, when executed, causes the processor to:

upload a plurality of data objects to a region of a cloud object storage platform, the region corresponding to a set of servers of the cloud object storage platform located in a defined geographic area, the plurality of data objects including modifications to a data set;

compute a parity object based on the plurality of data objects, the parity object encoding parity information for the plurality of data objects, the computing comprising, for each data object in the plurality of data objects:

adding data blocks of said each data object to an upload buffer; and performing a bitwise XOR of data content of the upload buffer with data content of a parity buffer, wherein the data content of the upload buffer includes the added data blocks, and wherein the performing of the bitwise XOR incorporates the data content of the upload buffer into the data content of the parity buffer; and upload the data content of the parity buffer as the parity object to the region of the cloud object storage platform.

16. The computer system of claim 15 wherein the program code further causes the processor to:

attempt to read a data object in the plurality of data objects from the region of the cloud object storage platform; and upon failure of the read attempt:

read the parity object and other data objects in the plurality of data objects from the region; and reconstruct the data object based on the parity object and the other data objects.

17. The computer system of claim 15 wherein the plurality of data objects are maintained in the region of the cloud object storage platform using a log-structured file system (LFS) disk layout.

18. The computer system of claim 15 wherein each of the plurality of data objects is uploaded to the region in a streaming manner via chunks that are each smaller in size than a predefined size for said each data object.

19. The computer system of claim 15 wherein a garbage collector running in the region garbage collects the plurality of data objects in a manner that is aware of the parity object.

20. The computer system of claim 19 wherein the garbage collector garbage collects the plurality of data objects by:

identifying the plurality of data objects as a single unit to be garbage collected;

determining live data blocks in the plurality of data objects;

reading the live data blocks;

writing out the live data blocks to a plurality of new data objects in the region;

computing a new parity object based on the plurality of new data objects;

writing out the new parity object in the region; and marking the plurality of data objects and the parity object as being deleted.

21. The computer system of claim 19 wherein the garbage collector garbage collects the plurality of data objects by:

identifying a subset of the plurality of data objects as being candidate data objects for garbage collection; and for each candidate data object:

determining live data blocks in the candidate data object;

reading the live data blocks;

writing out the live data blocks to a new data object in the region;

computing a new parity object for the plurality of data objects based on the candidate data object and the parity object;

writing out the new parity object in the region; and marking the candidate data object and the parity object as being deleted.

\* \* \* \* \*